(12) United States Patent
Iwayama

(10) Patent No.: US 10,193,058 B2
(45) Date of Patent: Jan. 29, 2019

(54) MAGNETORESISTIVE MEMORY DEVICE AND MANUFACTURING METHOD OF THE SAME

(71) Applicant: Toshiba Memory Corporation, Minato-ku, Tokyo (JP)

(72) Inventor: Masayoshi Iwayama, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 355 days.

(21) Appl. No.: 15/261,786

(22) Filed: Sep. 9, 2016

(65) Prior Publication Data
US 2017/0263856 A1 Sep. 14, 2017

Related U.S. Application Data

(60) Provisional application No. 62/308,128, filed on Mar. 14, 2016.

(51) Int. Cl.
| | |
|---|---|
| *H01L 43/08* | (2006.01) |
| *H01L 43/10* | (2006.01) |
| *H01L 43/12* | (2006.01) |
| *H01L 27/22* | (2006.01) |

(52) U.S. Cl.
CPC ............ *H01L 43/08* (2013.01); *H01L 27/228* (2013.01); *H01L 43/10* (2013.01); *H01L 43/12* (2013.01)

(58) Field of Classification Search
CPC ....... H01L 43/08; H01L 27/228; H01L 43/10; H01L 43/12; H01L 27/22; G11C 11/15
See application file for complete search history.

(56) References Cited

U.S. PATENT DOCUMENTS

| | | | |
|---|---|---|---|
| 8,374,048 B2 | 2/2013 | Apalkov | |
| 8,513,751 B2 | 8/2013 | Asao | |
| 8,604,569 B2 | 12/2013 | Hosotani et al. | |
| 2002/0041515 A1* | 4/2002 | Ikeda ................. | B82Y 10/00 365/158 |
| 2012/0032288 A1 | 2/2012 | Tomioka | |
| 2013/0005148 A1* | 1/2013 | Sonoda ............. | H01L 21/31053 438/692 |
| 2013/0113058 A1* | 5/2013 | Fukami .................. | H01L 43/08 257/421 |
| 2014/0084402 A1* | 3/2014 | Shimomura .......... | G11C 11/161 257/427 |
| 2014/0269037 A1* | 9/2014 | Saida .................... | G11C 11/161 365/158 |
| 2014/0284738 A1 | 9/2014 | Nakazawa et al. | |

(Continued)

*Primary Examiner* — Syed Gheyas
*Assistant Examiner* — S. M. S Imtiaz
(74) *Attorney, Agent, or Firm* — Holtz, Holtz & Volek PC

(57) ABSTRACT

According to one embodiment, a magnetoresistive memory device includes a first magnetic layer, a second magnetic layer on one major surface side of the first magnetic layer via a first nonmagnetic layer, a third magnetic layer on the second magnetic layer via a first Ru layer, a sidewall insulating film on sides of the layers, a fourth magnetic layer on an other major surface side of the first magnetic layer via a second nonmagnetic layer, and a fifth magnetic layer on the fourth magnetic layer via a second Ru layer. The reversed magnetic field of the second magnetic layer is smaller than that of the third and fourth magnetic layers, and the reversed magnetic field of the fifth magnetic layer is smaller than that of the third and fourth magnetic layers.

8 Claims, 11 Drawing Sheets

(56) References Cited

U.S. PATENT DOCUMENTS

2014/0300996 A1* 10/2014 Murakami .......... G11B 5/4833
360/246.1
2016/0035970 A1* 2/2016 Tang .................. H01L 27/222
257/427

* cited by examiner

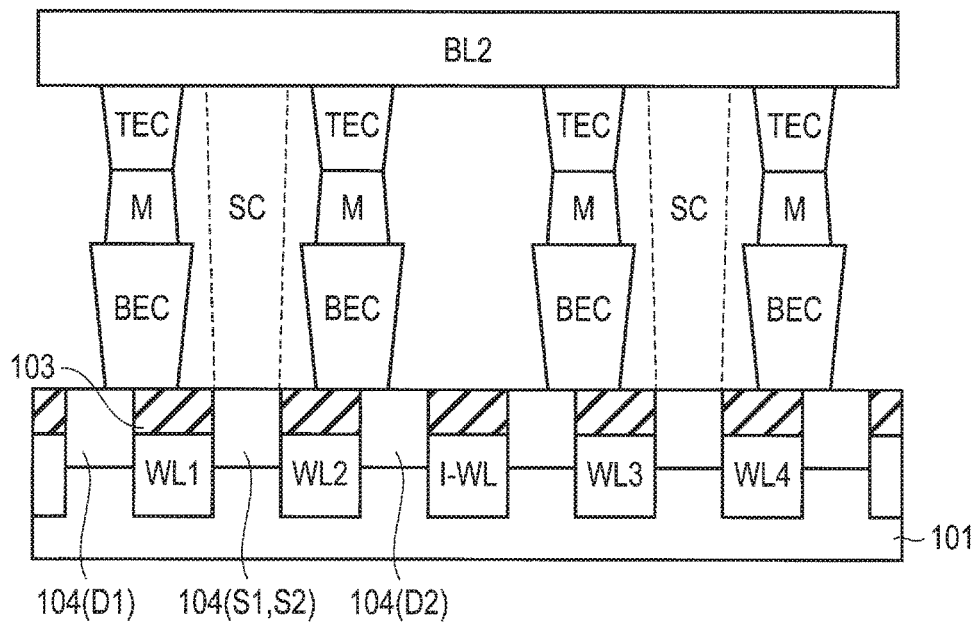
F I G. 2
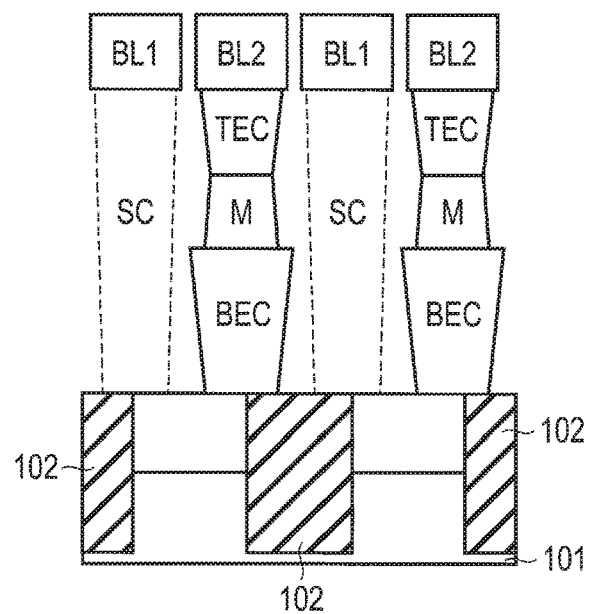
F I G. 3

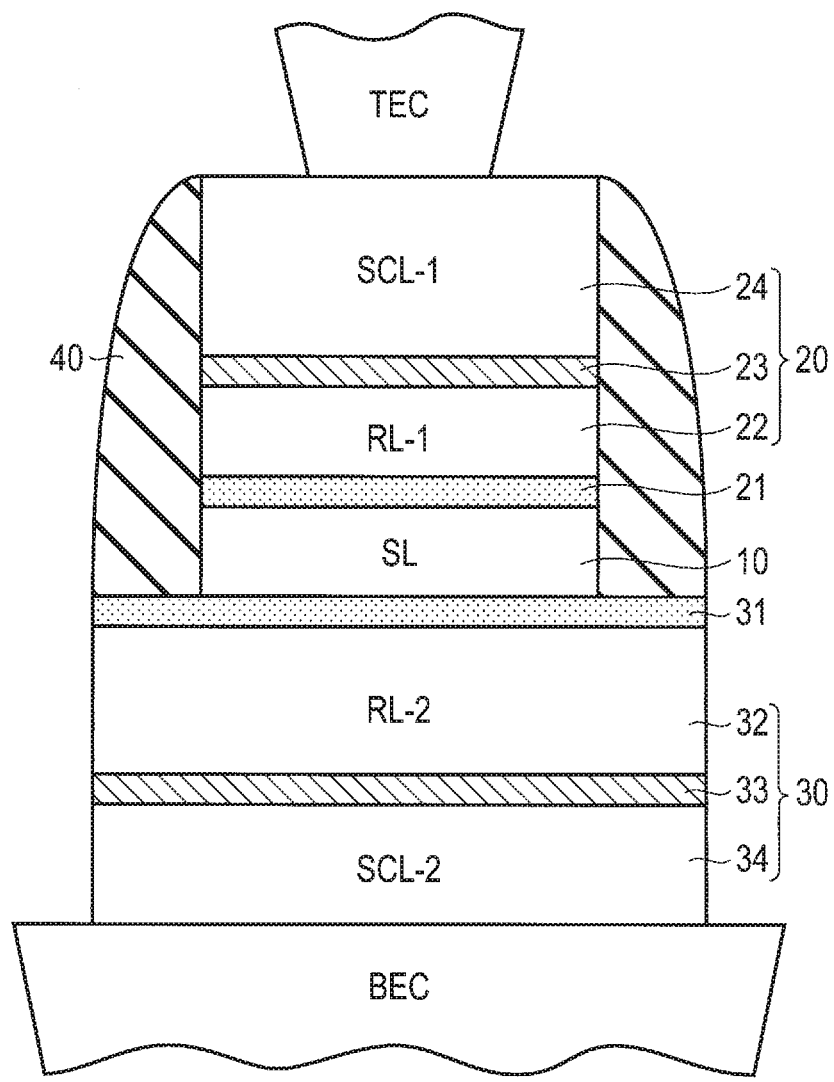
F I G. 4

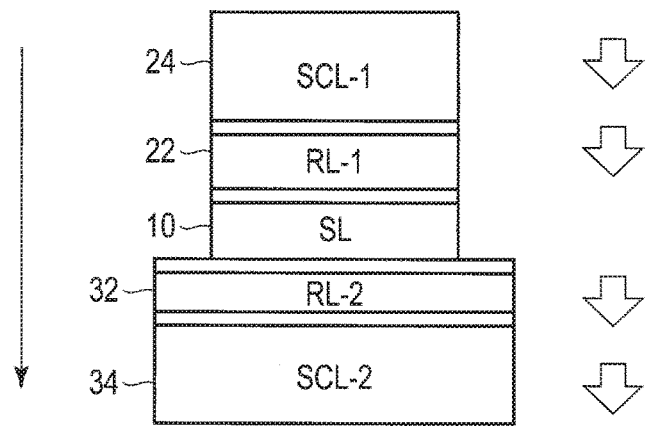
F I G. 8A
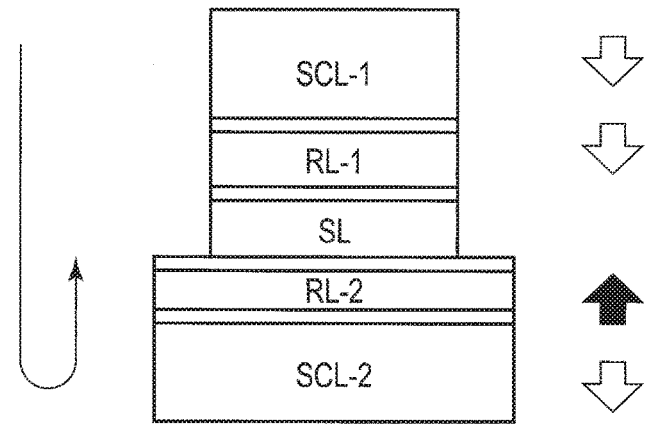
F I G. 8B
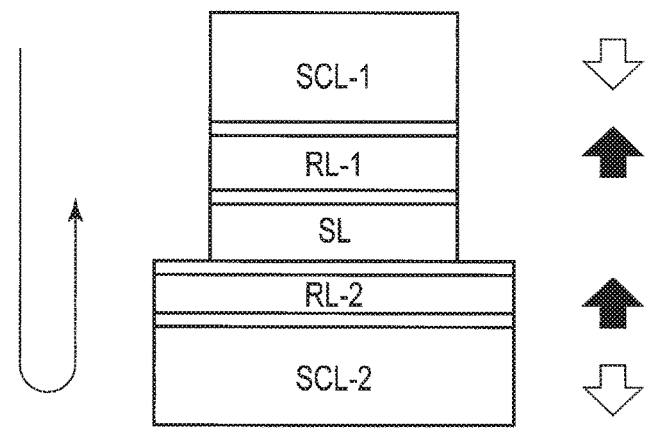
F I G. 8C

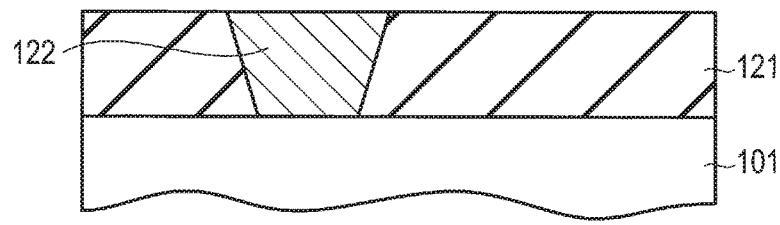
F I G. 11A
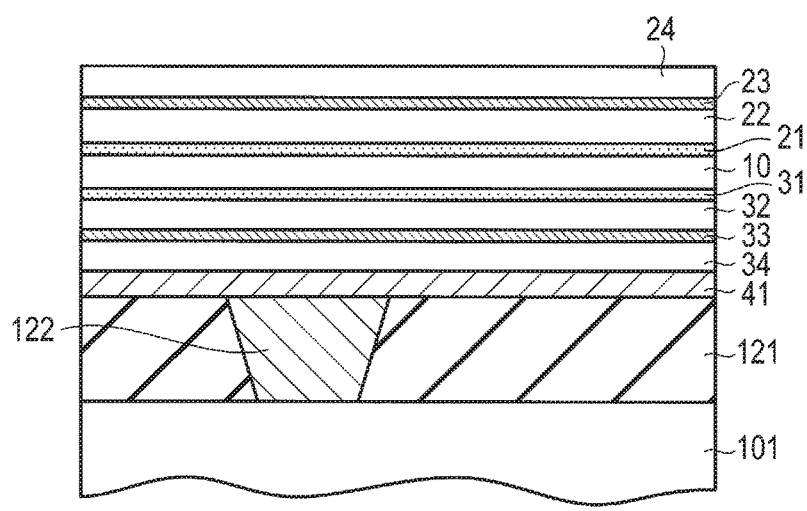
F I G. 11B
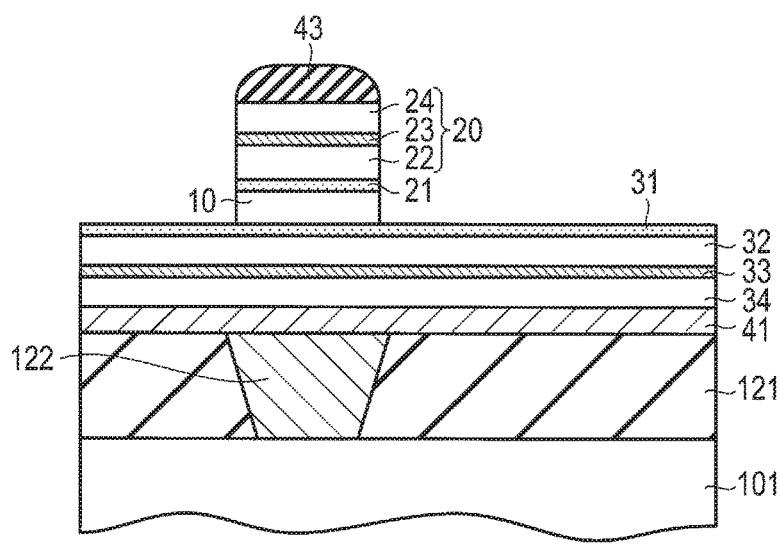
F I G. 11C

MAGNETORESISTIVE MEMORY DEVICE AND MANUFACTURING METHOD OF THE SAME

CROSS-REFERENCE TO RELATED APPLICATIONS

This application claims the benefit of U. S. Provisional Application No. 62/308,128, filed Mar. 14, 2016, the entire contents of which are incorporated herein by reference.

FIELD

Embodiments described herein relate generally to a magnetoresistive memory device and a manufacturing method thereof.

BACKGROUND

In recent years, a large-capacity magnetoresistive random access memory (MRAM) using a magnetic tunnel junction (MTJ) element has been expected and attracting attention. An MTJ element includes a tunnel barrier layer and two magnetic layers sandwiching the tunnel barrier layer, one of the two magnetic layers being a magnetization fixed layer (reference layer) in which the magnetization is fixed so that the direction of magnetization does not change, the other being a magnetization free layer (storage layer) which the direction of magnetization may be easily reversed. Further, in some cases, a shift cancelling layer is provided to suppress the influence of fringing field.

BRIEF DESCRIPTION OF THE DRAWINGS

FIG. 2 is a sectional view taken along the line I-I' of FIG. 1.

FIG. 3 is a sectional view taken along the line II-II' of FIG. 1.

FIG. 4 is a sectional view showing the structure of a memory cell portion of the magnetoresistive memory device according to the first embodiment.

FIGS. 8A to 8C are schematic diagram: showing a method of setting the magnetization of a reference layer and a shift cancelling layer.

FIGS. 11A to 11E are sectional views showing a manufacturing process of the memory cell portion of FIG. 10.

DETAILED DESCRIPTION

In general, according to one embodiment, a magnetoresistive memory device comprises: a first magnetic layer; a second magnetic layer provided on one major surface side of the first magnetic layer via a first nonmagnetic layer; a third magnetic layer provided on the second magnetic layer, which is opposite to the first magnetic layer via a first Ru layer; a sidewall insulating film provided on the sides of the first to third magnetic layers; a fourth magnetic layer provided on an other major surface side of the first magnetic layer via a second nonmagnetic layer; and a fifth magnetic layer provided on the fourth magnetic layer, which is opposite to the first magnetic layer via a second Ru layer. The reversed magnetic field of the second magnetic layer is smaller than that of the third and fourth magnetic layers, and the reversed magnetic field of the fifth magnetic layer is smaller than that of the third and fourth magnetic layers.

(First Embodiment)

Figure 1:
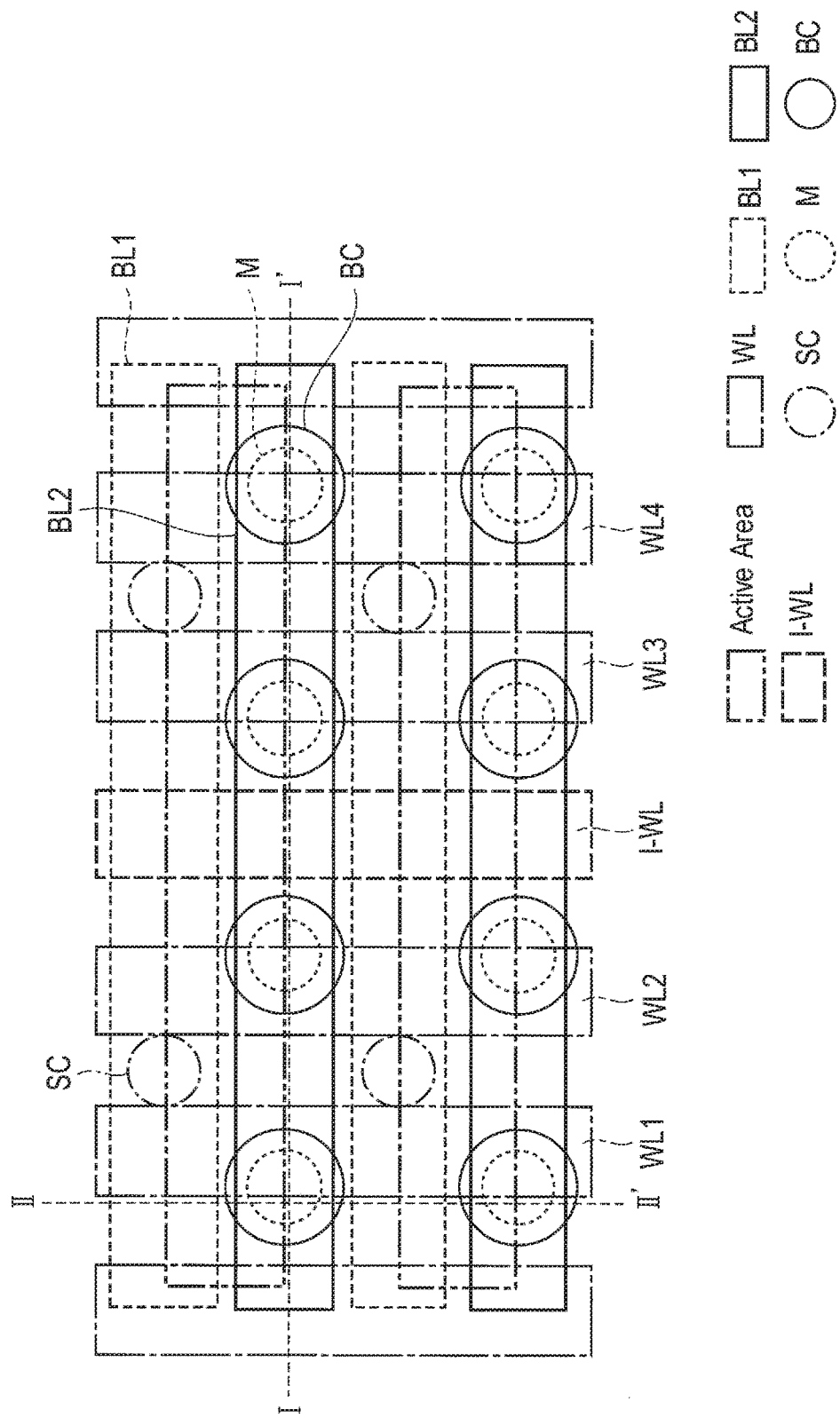
FIG. 1 is a plan view schematically showing a magnetoresistive memory device according to the first embodiment.

FIG. 1 is a plan view schematically showing the magnetoresistive memory device according to the first embodiment. FIG. 2 is a sectional view taken along the line I-I' of FIG. 1 and FIG. 3 is a sectional view taken along the line II-II' of FIG. 1. The members illustrated by dashed lines in FIGS. 2 and. 3 show plugs SC in a back side, which are not seen in the I-I' section or section.

The magnetoresistive memory device of this embodiment is an MRAM comprising an MTJ element (magneto-resistive effect element) of a spin transfer torque write type as a storage device. A perpendicular magnetization film is employed as the MTJ element. The perpendicular magnetization film is a magnetization film in which the direction of magnetization (direction of axis of easy magnetization) is substantially perpendicular to the surface of the perpendicular magnetization film.

In the drawings, 101 indicates a silicon substrate (a semiconductor substrate), and an element isolation region 102 is formed on a surface of the silicon substrate 101. The element isolation region 102 defines an active region.

The MRAM of this embodiment comprises a first select transistor whose gate electrode is a word line WL1, a first MTJ element F connected to one of source-drain areas 104 (that is, drain area D1) of the first select transistor, a second select transistor whose gate electrode is a word line WL2, and a second MTJ element M connected to one of the source-drain areas 104 (that is, drain area D2) of the second select transistor. The figures also illustrate a protective insulation film 103. That is, one memory cell of this embodiment comprises one MTJ(storage device) and one select transistor, and two select transistors of adjacent memory cells share the source-drain areas 104 of the other side (source regions S1 and S2).

The gate (gate insulating film and gate electrode) of the select transistor of this embodiment is embedded in the surface of the silicon substrate 101. In other words, the gate of the select transistor has a buried gate (BC) structure. Similarly, the gate for element isolation (that is, word line I-WL) also has a BG structure.

The source-drain area 104 (D1) of the first select transistor is connected to the bottom of the first MTJ element M via a bottom electrode BEC. The top of the first MTJ element M is connected to a bit line BL2 via a top electrode TEC. The other source-drain area 104 (S1) of the first select transistor is connected to a bit line BL1 via a plug SC.

In this embodiment, the planer patterns of the bottom electrode BEC, MTJ element M, top electrode TEC and plug SC are circular, but they may be other shapes.

The source-drain area 104 (D2) of the second select transistor is connected to the bottom of the second MTJ element M via the bottom electrode BEC. The top of the second MTJ element M is connected to a bit line BL2 via the top electrode TEC. The other source-drain area 104 (S2) of the second select transistor is connected to the bit line BL1 via the plug SC.

The first select transistor, the first MTJ element M, the second select transistor and the second MTJ element M (two memory cells) are provided for each active area. Two adjacent active areas are separated by the element isolation area 102.

Word lines WL3 and WL4 correspond to the word lines WL1 and WL2, respectively. Therefore, the first select transistor whose word line WL3 is a gate, the first MTJ element M connected to one source-drain area of the first select transistor, the second select transistor whose word line WL4 is a gate and the second MTJ element M connected to one source-drain area of the second select transistor constitute two memory cells.

Note that the layout of the MTJ elements, BL, WL, etc. is not limited to that shown in FIGS. 1 to 3. For example, as shown in patent literature 1 (US 2014/0284738 A1), BL1 may be provided in a layer lower than that of BL2 in the structure. Furthermore, as shown in patent literature 2 (U.S. Pat. No. 8,513,751 B-2), the active area may he inclined with respect to the gate electrode in the structure.

FIG. 4 is a sectional view showing a concrete structure of the MTJ element part used for this embodiment.

A first reference layer (a second magnetic layer [RL-1]) 22 is formed on a major surface (upper surface) side of a storage layer (first magnetic layer [SL]) 10 to store data via a tunnel barrier layer (first nonmagnetic layer) 21. A first shift cancelling layer (a third magnetic layer [SCL-1]) 24 is formed on a surface of the first reference layer 22, which is opposite to the storage layer 10 via a first Ru layer 23. A second reference layer (a fourth magnetic layer [RL-2]) 32 is formed on the other main surface (lower surface) side of the storage layer 10 via a tunnel barrier layer (second nonmagnetic layer) 31. A second shift cancelling layer (fifth magnetic layer [SCL-2]) 34 is formed on a surface of the second reference layer 32, which is opposite to the storage layer 10 via a second Ru layer 33.

As described above, this embodiment employs the structure of a dual junction MTJ element, which includes the reference layers 22 and 32 are arranged on both sides of the storage layer 10 in order to improve the write efficiency in the storage layer 10.

Note that these layers 10 to 34 are formed between the bottom electrode (BEC) and the top electrode (TEC). In other words, the second shift cancelling layer 34 is formed on the bottom electrode (BEC) and the layers 10 to 34 are processed into the pattern of the MTJ element (for example, circular). Further, the top electrode (TEC) is connected to the fist shift cancelling layer 24.

The storage layer 10 is of CoFeB, for example, and has magnetic anisotropy perpendicular to the film surface, with variable the magnetization direction. The material of the storage layer 10 is not limited to CoFeB, but various kinds of magnetic substances can be employed.

The tunnel barrier layers 21 and 31 are layers in which tunnel current is allowed to flow, and various kinds of nonmagnetic substances can be employed therefor. In this embodiment, for example, the tunnel barrier layer 21 is of Cu or MgO and the tunnel barrier layer 31 is of MgO. Moreover, the tunnel barrier layer 31 is thinner than the tunnel barrier layer 21. It suffices if the tunnel barrier layers 21 and 31 are of nonmagnetic layers, for which an oxide containing not only Cu or MgO but Si, Ba, Ca, La, Mn, Zn, Hf, Ta, Ti, B, Cr, V, or Al may be used.

The reference layers 22 and 32 consist of CoFeB, for example, and have magnetic anisotropy perpendicular to the film surface, with fixed magnetization direction. The material of the reference layers 22 and 32 is not limited to CoFeB, but various kinds of magnetic substances can be employed. For example, it is possible to use Fe/Pt (artificial lattice structure by a lamination structure of Fe and Pt), Fe/Pd, Co/Pt, Co/Pd, CoCrPt or CoCrPd. The reference layers 22 and 32 have magnetization directions reverse to each other.

The shift cancelling layers 24 and 34 are of Fe/Pt, for example, and nave magnetic anisotropy perpendicular to the film surface, with the fixed magnetization direction. The material of the shift cancelling layers 24 and 34 is not limited to Fe/Pt, but various kinds of magnetic substances can be employed as in the case of the reference layers 22 and 32. In this embodiment, for example, the reference layer 32 and the shift cancelling layer 24 may be of Fe/Pt, Fe/Pd, CoCrPt or CoCrPd and the reference layer 22 and the shift cancelling layer 34 may be of Co/Pt and Co/Pd.

Note that the magnetization direction of the first shift cancelling layer 24 is opposite to that of the first reference layer 22 and the magnetization direction of the second shift cancelling layer 34 is opposite to that of the second reference layer 32.

The Ru layers 23 and 33 may be of some other metal material as long as they are suitable for making the upper and lower magnetic layers to be anti-parallel to each other. The thickness of the Ru layers 23 and 33 is sufficiently thin as compared to the reference layers 22 and 32, the shift cancelling layers 24 and 34 or the like, and it is, for example, 3 to 7 nm.

The reference layer 22, Ru layer 23 and shift cancelling layer 24 form a synthetic anti-ferromagnetic (SAP) structure 20 in which two magnetic layers are anti-ferromagnetically exchange-coupled. Similarly, the reference layer 32, Ru layer 33 and shift cancelling layer 34 also form an SAP structure 30. Thus, the magnetoresistive memory device of this embodiment comprises a dual junction MTJ element which employs the SAF structure.

The storage layer 10, tunnel barrier layer 21, reference layer 22, Ru layer 23 and shift cancelling layer 24 have widths or diameters less than those of the tunnel barrier layer 31, reference layer 32, Ru layer 33 and shift cancelling layer 34, respectively. More specifically, the layers 10, 21 to 24 and 31 to 34 are stacked one on another, and then the storage layer 10, tunnel barrier layer 21, reference layer 22, Ru layer 23 and shift cancelling layer 24 are etched into the pattern of the MTJ element. Further, the tunnel barrier layer 31, reference layer 32, Ru layer 33 and shift cancelling layer 34 are etched into a pattern slightly greater than the MTL element pattern.

A sidewall insulating film (side wall spacer) 40 of silicon nitride or the like is provided on the side surfaces of the storage layer 10, tunnel barrier layer 21, reference layer 22, Ru layer 23 and shift cancelling layer 24. This embodiment employs such a structure that a step is produced between an upper SAF structure 20 and a lower SAF structure 30.

Note that thickness T2 ($T_{RL1}$) of the first. reference layer 22, thickness 13 ($T_{SCL1}$) of the first shift cancelling layer 24, thickness 14 ($T_{RL2}$) of the second reference layer 32 and thickness T5 ($T_{SCL2}$) of the second shift cancelling layer 34 are such that:

$$T_{RL1} < T_{SCL2} < T_{RL2} < T_{SCL1} \tag{1}$$

Further, reversed magnetic field $H_{RL1}$ of the first reference layer 22, reversed magnetic field $H_{SCL1}$ of the first shift cancelling layer 24, reversed magnetic field $H_{RL2}$ of the second reference layer 32 and reversed magnetic field $H_{SCL2}$ of the second shift cancelling layer 34 are such that:

$$H_{RL1} < H_{SCL2} < H_{RL2} < H_{SCL1} \quad (2).$$

This is because, if similar types of materials are used the magnetic layers, not only the intensity of the magnetic field becomes proportional to the thickness of the film, but also the magnitude of the reversed magnetic field is proportional to the thickness of the film.

Next, how to determine the magnetization of the magnetic layers 22, 34, 32 and 34 of the magnetoresistive memory device of this embodiment will be described.

First, the layers 34, 33, 32, 31, 10, 21, 22, 23, and 24 are formed in this order on a bottom electrode (BEC). Here, the thicknesses of the first reference layer (RL-1) 22, first shift cancelling layer (SCL-1) 24, second reference layer (RL-2) 32 and second shift cancelling layer (SCL-2) 34 are set according to the relationship (1).

Next, a mask material layer (not shown) of silicon. nitride is formed on the shift cancelling layer 24, and then the shift cancelling layer 24, Ru layer 23, reference layer 22, tunnel barrier layer 21 and storage layer 10 are selectively etched into an MTJ element pattern. Subsequently, an insulating sidewall film 40 of silicon nitride, for example, is formed on the sides of the layers 24, 23, 22, 21 and 10 exposed by the etching. After that, using the mask material layer and the insulating sidewall film 40 as a mask, the tunnel barrier layer 31, reference layer 32, Ru layer 33 and shift cancelling layer 34 are selectively etched.

Figure 5A:
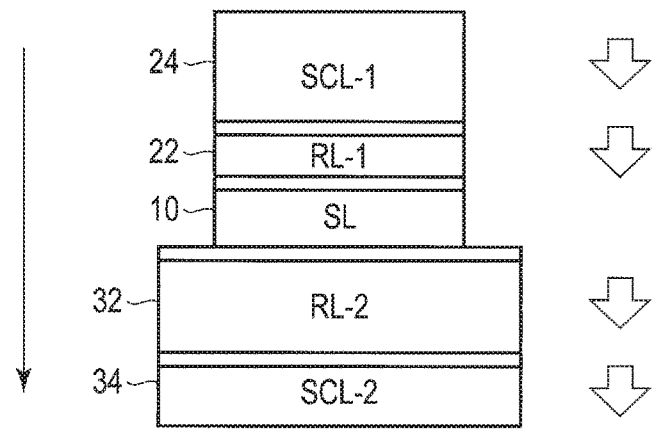
FIGS. 5A to 5C are schematic diagrams showing a method of setting the magnetization of a reference layer and a shift cancelling layer.

The resultant structure thus prepared is exposed to a first external magnetic field applied thereto perpendicular to the film surface, as shown in FIG. 5A, so as to uniform the magnetization directions of the reference layers 22 and 32 (RL-1, RL-2) and the shift cancelling layers 24 and 34 (SCL1, SCL-2). Note that the magnetization directions of these layers are uniformed here in the downward direction, but they may be all directed upward.

Figure 5B:
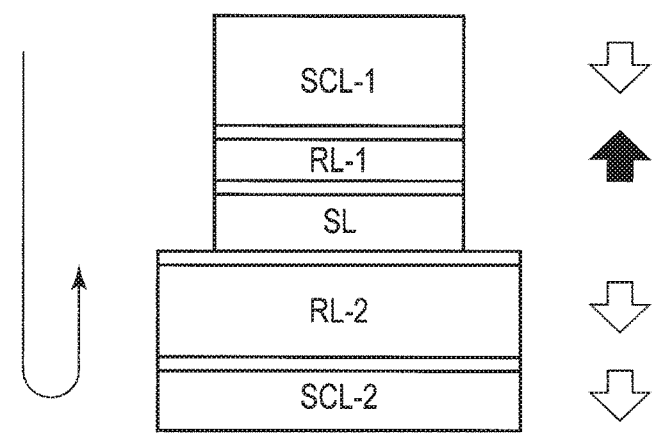

Subsequently, as shown in FIG. 5B, a second external magnetic field weaker than the first external magnetic field and in a direction opposite to that of the first external magnetic field is applied to the structure, and thus the magnetization direction of the first reference layer (RL-1) 22, which is the thinnest film of the layers 22, 24, 32 and 34, is reversed.

Figure 5C:
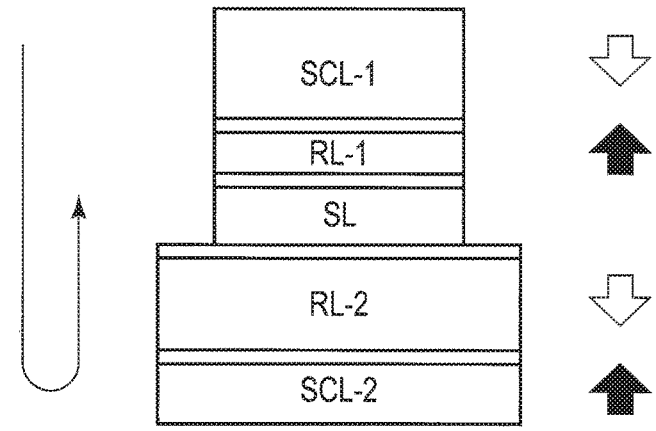

Further, as shown in FIG. 5C, a third external magnetic field stronger than the second external magnetic field and in the same direction as that of the second external magnetic field is applied to the structure, and thus the magnetization direction of the second shift cancelling layer (SCL-2) 34, which is the second thinnest film, is reversed.

Note that arrows appearing on left-hand sides of FIGS. 5A to 5C show how the external magnetic fields are applied. FIG. 5A illustrates that the downward first external magnetic field is applied. FIG. 5B illustrates that the downward first external magnetic field is applied and then an upward second external magnetic field weaker than the first external magnetic field is applied. FIG. 5C illustrates that an upward third larger external magnetic field, which is stronger than the second external magnetic field but weaker than the first external magnetic field is applied after applying the second external magnetic field.

Figure 6:
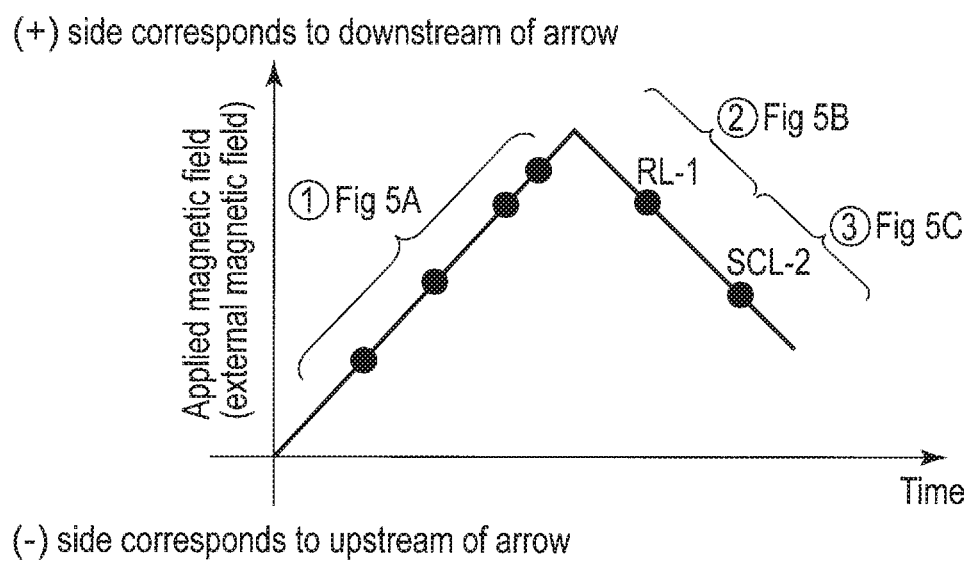
FIG. 6 is a schematic diagram showing how the magnetic field of the magnetic layer is reversed by application of an external magnetic field.

FIG. 6 shows how the magnetic field of the magnetic layers is reversed during the external magnetic field applied once to a (+) side is then gradually reduced from a maximum of the (+) side. The (+) side corresponds to a section below the arrow on the left-hand side of each of FIGS. 5A to 5C, whereas an (−) side corresponds to a section above the arrow on the left-hand side of each of FIGS. 5A to 5C. If the external magnetic field is applied to the maximum on the (+) side, all of SCL-1, RL-1, SCL-2 and RL-2 are magnetized downward (FIG. 5A). Here, the order of the layers in the magnetization is arbitrary. While decreasing the external magnetic field to the (−) side, RL-1 is reversed first (FIG. 5B) and then SCL-2 is reversed (FIG. 5C).

The reason that the magnetic fields of the first reference layer 22 and the second shift cancelling layer 34 are reversed in the above-described manner is that as the thickness of the magnetic layer is less, the magnetization direction can be more easily reversed. Further, as shown in FIGS. 5B and 5C, the first, second and third external magnetic fields may not be applied in this order, but it is possible to apply the third external magnetic field after the first external magnetic field.

Here, the stray magnetic field in the storage layer 10 is greatly affected by the magnetic field produced the edge of the reference layer. In this embodiment, the edge of the second reference layer 32, which has a strong magnetic field, is apart from the edge of the storage layer 10. With this structure, the influence of the stray magnetic field from reference layer 32 of the strong magnetic field can be reduced. Further, among the layers 22, 24, 32 and 34, the reference layer 22 has the weakest magnetic field, the influence of the stray magnetic field by the edge of the reference layer 22 also can be reduced. Thus, the stray magnetic field in the storage layer 10 can be reduced.

Figure 7A:
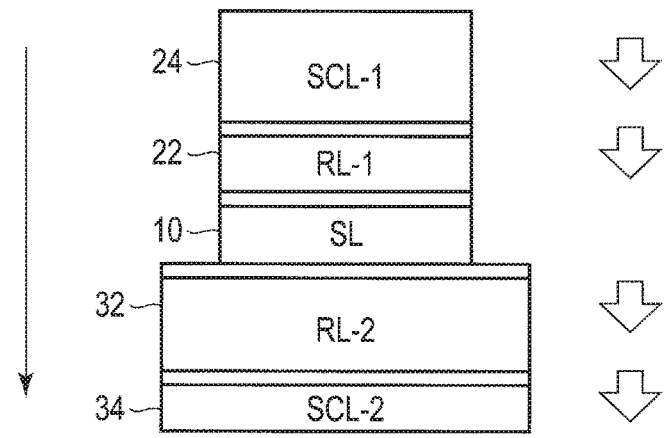
FIGS. 7A to 7C are schematic diagrams showing a method of setting the magnetization of a reference layer and a shift cancelling layer.
Figure 7B:
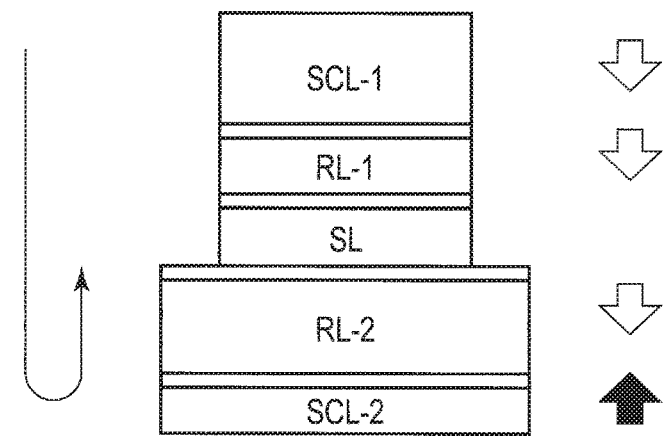
Figure 7C:
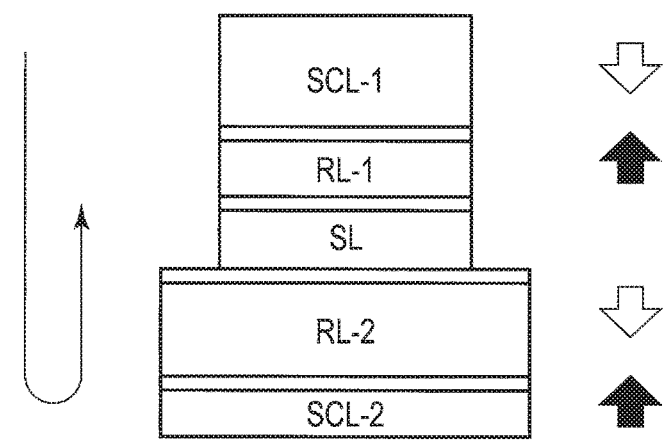

The method of setting the magnetic field is not necessarily limited to that shown in FIGS. 5A to 5C, but it may be the method shown in FIGS. 7A to 7C.

As shown in FIG. 7A, the thicknesses of the first reference layer (RL-1) 22, the first shift cancelling layer (SCL-1) 24, the second reference layer (RL-2) 32 and the second shift cancelling layer (SCL-2) 34 are set such that:

$$T_{SCL-2} < T_{RL-1} < T_{RL2} < T_{SCL1} \quad (3).$$

In this state, the first external magnetic field is applied as in the case shown in FIG. 5A.

Next, as shown in FIG. 7B, the second external magnetic field, which is weaker than the first external magnetic field and in the opposite direction to that of the first external magnetic field is applied to reverse the magnetization direction of the second shift-cancelling layer (SCL-2) 34, which is the thinnest of the layers 22, 24, 32 and 34.

Further, as shown in FIG. 7C, the third external magnetic field stronger than the second external magnetic field and in the same direction as that of the second external magnetic field is applied to reverse the magnetization direction of the second thinnest first reference layer (RL-1) 22.

Also in this case, since the edge of the second reference layer 32 having a strong magnetic field can be placed apart from the edge of the storage layer 10, and therefore an effect similar to the case shown in FIGS. 5A to 5C is obtained. Note that the magnetic field of the first reference layer 22 is weaker than that of the second reference layer 32 or the first shift cancelling layer 24, but stronger than that of the second shift cancelling layer 34. As a result, the effect of the edge of the reference layer 22 becomes greater than the case shown in FIGS. 5A to 5C. For this reason, as the method of determining the magnetic field, the method shown in FIGS. 5A to 5C is more desirable.

There are methods of setting a magnetic field such as shown in FIGS. 8A to 8C and FIGS. 9A to 9C, but these methods are not desirable in the following points.

That is, as shown in FIG. 8A, the thicknesses of the first reference layer (RL-1) 22, the first shift cancelling layer (SCL-1) 24, the second reference layer (RL-2) 32 and the second shift cancelling layer (SCL-2) 34 are such that:

$$T_{RL2} < T_{RL\text{-}1} < T_{SCL\text{-}2} < T_{SCL1} \quad (4).$$

In this state, the first external magnetic field is applied as in the case shown in FIG. 5A.

Next, as shown in FIG. 8B, the second external magnetic field, which is weaker than the first external magnetic field and in the opposite direction to that of the first external magnetic field is applied to reverse the magnetization direction of the second reference layer (RL-2) 32, which is the thinnest of the layers 22, 24, 32 and 34.

Further, as shown in FIG. 8C, the third external magnetic field stronger than the second external magnetic field and in the same direction as that of the second external magnetic field is applied to reverse the magnetization direction of the second thinnest first reference layer (RL-1) 22.

In the above-described case, the magnetization direction of the reference layers 22 and 32 becomes the same as that of the storage layer 10. As a result, the advantageous effect of the dual function MTJ element, that is, the improvement of the write efficiency in the storage layer 10 cannot be obtained.

Figure 9A:
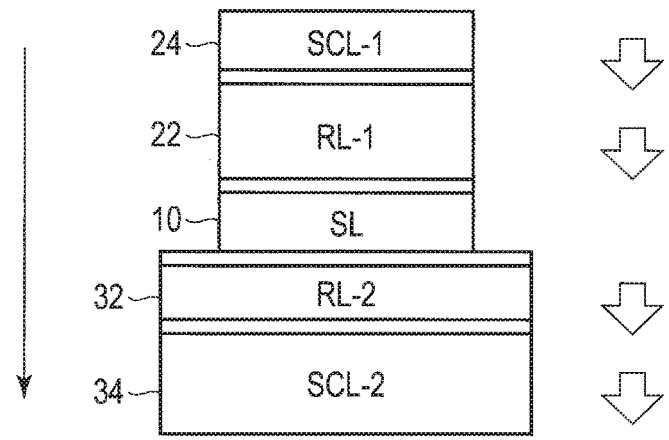
FIGS. 9A to 9C are schematic diagrams showing a method of setting the magnetization of a reference layer and a shift cancelling layer.

As shown in FIG. 9A, the thicknesses of the first reference layer (RL-1) 22, the first shift cancelling layer (SCL-1) 24, the second reference layer (RL-2) 32 and the second shift cancelling layer (SCL-2) 34 are set such that:

$$T_{SCL1} < T_{RL2} < T_{RL1} < T_{SCL2} \quad (5).$$

In this state, the first external magnetic field is applied as in the case shown in. FIG. 5A.

Figure 9B:
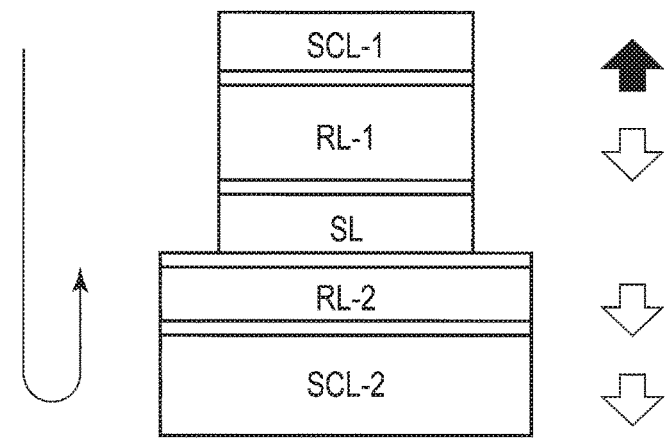

Next, as shown in FIG. 9B, the second external magnetic field, which is weaker than the first external magnetic field and in the opposite direction to that of the first external magnetic field is applied to reverse the magnetization direction of the first shift cancelling layer (SCL-1) 24, which is the thinnest of the layers 22, 24, 32 and 34.

Figure 9C:
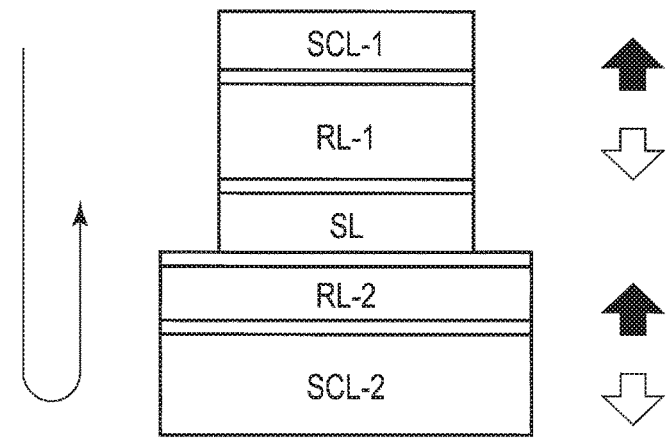

Further, as shown in FIG. 9C, the third external magnetic field stronger than the second external magnetic field and in the same direction as that of the second external magnetic field is applied to reverse the magnetization direction of the second thinnest second reference layer (RL-2) 32.

In the above-described case, the storage layer 10 will be strongly affected by the influence of the edge of the first reference layer 22, which has a larger magnetic field among the reference layers 22 and 32. In other words, the reference layer 22 having a strong magnetic field is located close to the storage layer 10. As a result, the advantageous effect which should be obtained by the sidewall spacer cannot be obtained.

As described above, according to this embodiment, the dual junction. MTJ element adopts an SAF structure and a sidewall spacer, with which the strength of the magnetic field. (reversed magnetic field) of each of the magnetic layers 22, 24, 32 and 34 is optimized. In this manner, the lateral-direction stray magnetic field in the storage layer 10 can be reduced. This is because, with the adoption of the SAF structure, the reference layers 22 and 32 can be thinned, and with the adoption of the side wall spacer, the edge of the reference layer 32, which has a large magnetic field, can he kept away from the storage layer 10. Thus, the write efficiency and the data retention characteristics in the MTJ element can be improved.

Here, in the dual junction MTJ element, the magnetization directions of the two reference layers 22 and 32 are opposite to each other, and therefore the stray magnetic field in the lateral direction is large in the storage layer 10. If the lateral-direction stray magnetic field becomes large, the element characteristic (Ic/Δ), which is determined by the write current Ic and the heat stability Δ are deteriorated. In other words, the object of improvement in the write efficiency becomes unachievable. On the other hand, in this embodiment, by adopting the SAF structure and sidewall spacer described above, which produces a difference in reversed magnetic field, the influence of the stray magnetic field produced can he minimized, thereby making it possible to improve the write efficiency and data retention characteristics.

(Second Embodiment)

Next, the structure of the memory cell portion including an MTJ element and the manufacturing method therefor will be described in more detail.

Figure 10:
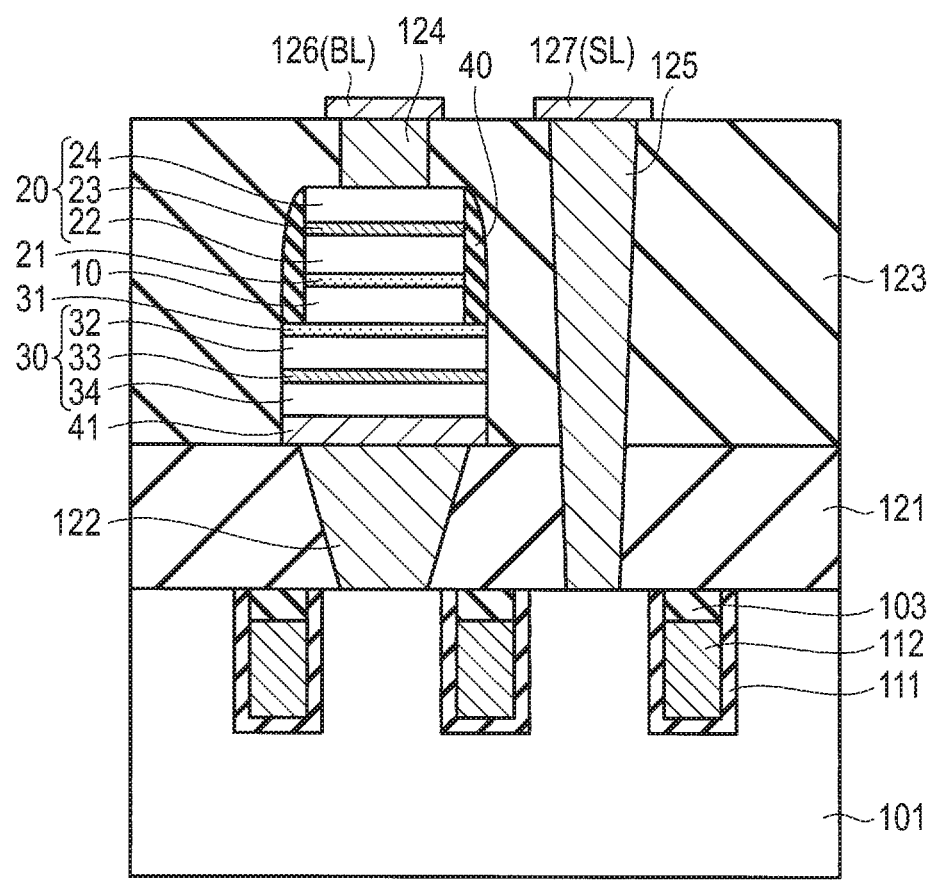
FIG. 10 is a sectional view showing the structure of a memory cell portion of a magnetoresistive memory device according to the second embodiment.

FIG. 10 is a sectional view showing the structure of a memory cell portion of a magnetoresistive memory device according to the second embodiment.

Switching MOS transistors are formed in a surface portion of an Si substrate 101, and an interlayer insulating film 121 is formed thereon. Each transistor has an embedded gate structure in which a gate electrode 112 is embedded in a groove made in the substrate 101 via a gate insulating film 111. The gate electrode 112 is embedded halfway in the groove, and a protective insulation film 103 is formed thereon. Moreover, p- or n-type impurities are diffused in the substrate 101 on both sides of the embedded gate structure, thereby forming a source-drain area, though not illustrated in the figure.

Note that the structure of the transistor is not limited to the type having an embedded gate structure. For example, such a structure may be adopted that a gate electrode is formed on the surface of the Si substrate 101 via a gate insulating film. The structure of the transistor may be arbitrary as long as it can function as a switching element.

A contact hole formed in the interlayer insulating film 121 to be connected to the drain of the transistor, and a bottom electrode (BEC) 122 is embedded in the contact hole. The bottom electrode 122 is of such a metal which has crystallinity, as TiN or W. The material of the bottom electrode 122 is not limited to these, but may be arbitrary as long as it can be embedded well in a contact hole, and has sufficient conductivity.

On the bottom electrode 122, layers 10 to 34, which give rise to an MTJ element, are formed and further a sidewall insulating film 40 is formed.

An interlayer insulating film 123 is formed on the substrate on which the MTJ element and the sidewall insulating films 40 were formed. A top electrode (contact plug: TEC) 124 connected to a first shift cancelling layer 24 of the MT J element part is embedded in the interlayer insulating film 123. Further, a contact plug 125 connected to the source or the transistor is embedded through the interlayer insulating film 123 and the interlayer insulating film 121. Then, an interconnecting line (BL) 126 connected to the contact plug 124 and an interconnecting line (SL) 127 connected to the contact plug 125 are formed on the interlayer insulating film 123.

Next, a method of preparing a memory cell portion of this embodiment will he described with reference to FIGS. 11A to 11E.

First, as shown in FIG. 11A, a switching MOS transistor (not shown) having an embedded gate structure on a surface portion of the Si substrate 101 is formed, and then the interlayer insulating film 121 of, for example, $SiO_2$, is deposited on the Si substrate 101 by a CVD method. Subsequently, a contact hole is formed in the interlayer insulating film 121, to be connected to the drain of the transistor, and then the bottom electrode 122 of crystalline Ta is embedded in the contact hole. More specifically, a TiN film is deposited on the interlayer insulating film 121 so as to berry the contact hole by a sputtering method or the like, and then the TiN film on the interlayer insulating film 121 is removed by chemical mechanical polishing (CMP), so that the TiN film remains only in the contact hole.

Next, as shown in FIG. 11B, on the interlayer insulating film 121 and the bottom electrode 122, the layers 34, 33 and 32 for the SAP structure 30, the second tunnel barrier layer 31, the storage layer 10, the first tunnel barrier layer 21 and the layers 22, 23 and 24 for the SAP structure 20 are formed by sputtering.

Note that before forming a magnetic material layer, a buffer layer 41 may be formed by sputtering. The buffer layer 41 should desirably be of a metal with. high electro-conductivity. Moreover, in order to suppress the diffusion to the upper layer side of the MTJ element, an electrically conductive oxide film or nitride film with may be employed.

Next, as shown in FIG. 11C, a mask material layer 43 of an MTJ element pattern is formed on the shift cancelling layer 24. Then, using the mask material layer 43 as the mask, the shift cancelling layer 24 to the storage layer 10 are selectively etched by an ion-beam. etching method.

Figure 11D:
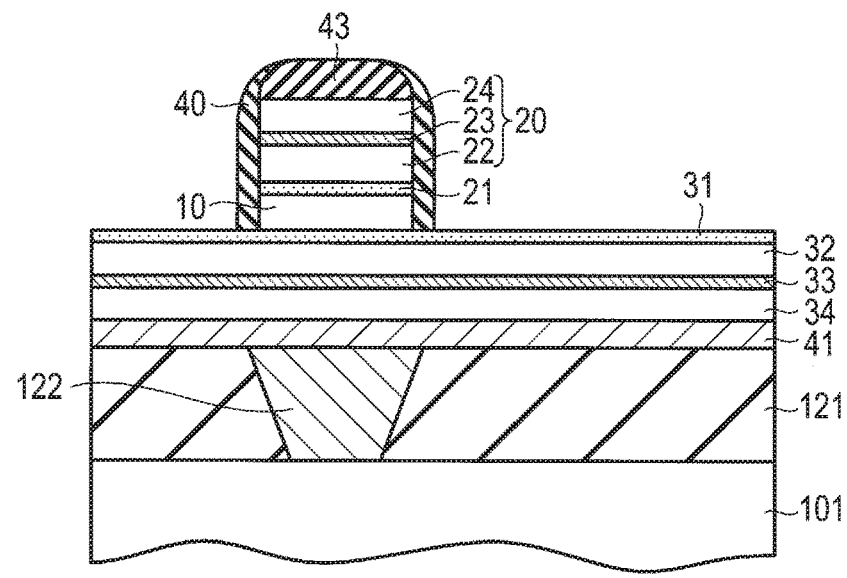

Next, as shown in FIG. 11D, a sidewall insulating films 40 is formed on the sides of the storage layer 10, tunnel barrier layer 21, reference layer 22, Ru layer 23 and shift cancelling layer 24. The sidewall insulating films 40 is formed in a self-aligned manner by depositing an insulating film such as SiN on the entire surface, followed by etching-back by an RIE method or the like.

Figure 11E:
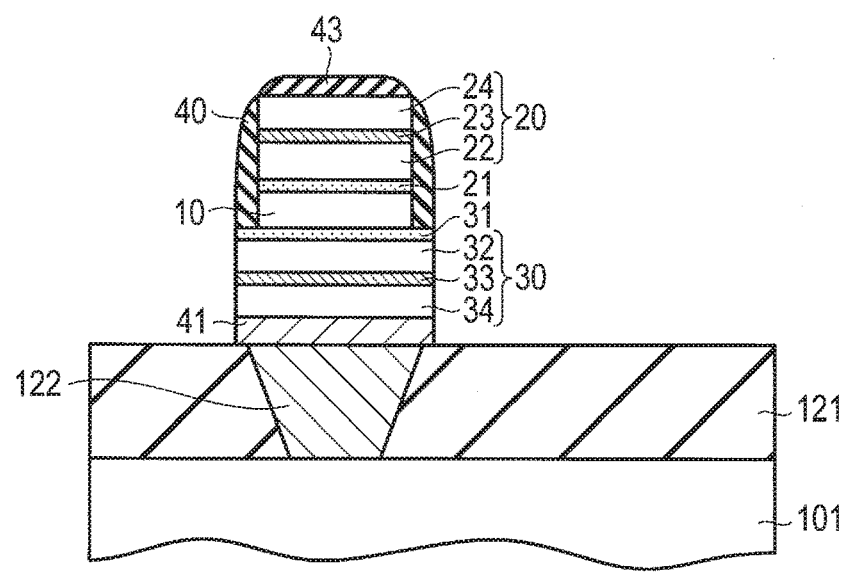

Next, as shown in FIG. 11E, using the mask material layer 43 and the sidewall insulating film 40 as the mask, the tunnel barrier layer 31 to the buffer layer 41 are selectively etched by the ion-beam etching method. Thus, the pattern of the MTJ element is obtained. Note that when an insulating film, such as of SiN is used as the mask material layer 43, the mask material layer 43 need to be removed after forming the MTJ pattern. On the other hand, when a conductive material such as Ta or Ru is used as the mask material layer 43, the mask material layer 43 may be left even after forming the pattern of the MTJ element.

Thereafter, the interlayer insulating film 123 of, for example, SiO$_2$, is formed, and then the contact plugs 124 and 125 and also the interconnecting lines 126 and 127 are formed. Thus, the structure shown in FIG. 10 is obtained.

As described above, according to this embodiment, the memory cell of a magnetoresistive memory device can be prepared by forming the dual junction MTJ element of SAF structure on a substrate including a select transistor. Further, the stray magnetic field in the storage layer 10 can be reduced by forming the side wall spacer and optimizing the intensity of the in magnetic field (reversed magnetic field) of each of the magnetic layers 22, 24, 32 and 34. Therefore, the write efficiency and data-retention characteristics in the MTJ element 10 can be improved.

(Modification)

The embodiments are riot limited to those discussed above.

In the embodiments described above, the SAF structure is formed on both sides of the storage layer, but a dual junction MTJ element having the SAF structure only on one side is also adoptable. In this case, the SAF structure may be located below the storage layer or thereabove (that is, on the side where there is the sidewall insulating film). When located above, it suffices if the magnetization directions of the first reference layer (RL-1) and the second reference layer (RL-2) are opposite to each other, and the magnetic field of the first reference layer is weaker than that of the second reference layer.

More specifically, when the second shift cancelling layer (SCL-2) is absent:

$T_{SCL1} > T_{RL1}$, $T_{RL2} > T_{RL1}$
$H_{SCL1} > H_{RL1}$, $H_{RL2} > H_{RL1}$ or when the first shift cancelling layer (SCL-1) is absent:

$T_{RL2} > T_{SCL2} > T_{RL1}$, $H_{RL2} > H_{SCL2} > H_{RL1}$.

Further, the materials of the layers are not limited to those described in the embodiments, but may be changed as needed according to specification. Further, the thickness of each layer can also be suitably changed according to specification.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device comprising:
   a first magnetic layer;
   a second magnetic layer provided on one major surface side of the first magnetic layer via a first nonmagnetic layer;
   a third magnetic layer provided on a surface side the second magnetic layer which is opposite from the first magnetic layer, via a first Ru layer;
   a sidewall insulating film provided on sides of the first to third magnetic layers;
   a fourth magnetic layer provided on another major surface side of the first magnetic layer via a second nonmagnetic layer, a side surface of the fourth magnetic layer being located on an outer side with respect to a side surface of the first magnetic layer; and
   a fifth magnetic layer provided on a surface side of the fourth magnetic layer which is opposite from the first magnetic layer, via a second Ru layer;
   wherein:
   the second and fourth magnetic layers comprise a material of a same kind, and the third and fifth magnetic layers comprise a material of a same kind,
   the second magnetic layer is thinner than the third and fourth magnetic layers, and
   the fifth magnetic layer is thinner than the third and fourth magnetic layers.

2. The device of claim 1, wherein:
   the second and fifth magnetic layers have a same magnetization direction, and
   the third and fourth magnetic layers have the same magnetization direction, but opposite to the magnetization directions of the second and fifth magnetic layers.

3. The device of claim 1, wherein:
   a reversed magnetic field of the second magnetic layer is smaller than that of the third and fourth magnetic layers, and
   a reversed magnetic field of the fifth magnetic layer is smaller than that of the third and fourth magnetic layers.

4. The device of claim 1, wherein:
the first magnetic layer is a storage layer which stores data,
the first and second nonmagnetic layers are barrier layers into which tunnel current flows,
the second and fourth magnetic layers are reference layers having magnetic anisotropy perpendicular to a film surface, and
the third and fifth magnetic layers are shift cancelling layers having magnetic anisotropy perpendicular to a film surface, which inhibit an influence of a stray magnetic field by the reference layers.

5. The device of claim 1, wherein each pair of the second and third magnetic layers and the fourth and fifth magnetic layers have an anti-ferromagnetic (synthetic anti-ferromagnetic [SAF]) structure in which the two magnetic layers are anti-ferromagnetically exchange-coupled.

6. The device of claim 1, wherein:
the third magnetic layer is thicker than the fourth magnetic layer, and
the second magnetic layer is thinner than the fifth magnetic layer.

7. The device of claim 1, wherein:
a reversed magnetic field of the third magnetic layer is stronger than that of the fourth magnetic layer, and
a reversed magnetic field of the second magnetic layer is weaker than that of the fifth magnetic layer.

8. The device of claim 1, wherein magnetization directions of the second to fifth magnetic layers are perpendicular to a surface of each of the layers.

* * * * *